(12) United States Patent
Huang et al.

(10) Patent No.: US 9,666,619 B2
(45) Date of Patent: May 30, 2017

(54) CMOS IMAGE SENSOR STRUCTURE

(71) Applicant: TAIWAN SEMICONDUCTOR MANUFACTURING CO., LTD., Hsinchu (TW)

(72) Inventors: Chien-Chang Huang, Tainan (TW); Wei-Tung Huang, Tainan (TW); Yen-Hsiang Hsu, Kaoshiung (TW); Yu-Lung Yeh, Kaohsiung (TW); Chun-Chieh Fang, Zhongpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/688,941

(22) Filed: Apr. 16, 2015

(65) Prior Publication Data
US 2016/0307946 A1    Oct. 20, 2016

(51) Int. Cl.
*H01L 27/00* (2006.01)
*H01L 27/146* (2006.01)

(52) U.S. Cl.
CPC ...... *H01L 27/1462* (2013.01); *H01L 27/1469* (2013.01); *H01L 27/14625* (2013.01); *H01L 27/14632* (2013.01); *H01L 27/14685* (2013.01); *H01L 27/14687* (2013.01); *H01L 27/14689* (2013.01)

(58) Field of Classification Search
CPC ............... H01L 27/14605; H01L 27/14607
See application file for complete search history.

(56) References Cited

U.S. PATENT DOCUMENTS

| 2012/0319998 | A1 | 12/2012 | Lai et al. | |
| 2015/0287761 | A1* | 10/2015 | Huang | H01L 27/1462 257/432 |

FOREIGN PATENT DOCUMENTS

| TW | 200627335 A | 8/2006 |
| TW | 201301100 A | 1/2013 |

* cited by examiner

*Primary Examiner* — William Harriston
(74) *Attorney, Agent, or Firm* — Maschoff Brennan

(57) ABSTRACT

A semiconductor device includes a carrier, a substrate, light-sensing devices and a bonding layer. The substrate overlies the carrier, and has a first surface and a second surface opposite to the first surface. The substrate includes inverted pyramid recesses in the second surface. The light-sensing devices are disposed on the first surface of the substrate. The bonding layer is disposed between the substrate and the carrier.

14 Claims, 14 Drawing Sheets

CMOS IMAGE SENSOR STRUCTURE

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. When light projected into the FSI CMOS image sensors or the BSI CMOS image sensors, photoelectrons are generated and then are sensed by light-sensing devices in pixels of the image sensors. The more the photoelectrons are generated, the more superior quantum efficiency (QE) the image sensor has, thus improving the image quality of the CMOS image sensors.

However, while CMOS image sensor technologies are rapidly developed, CMOS image sensors with higher quantum efficiency are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
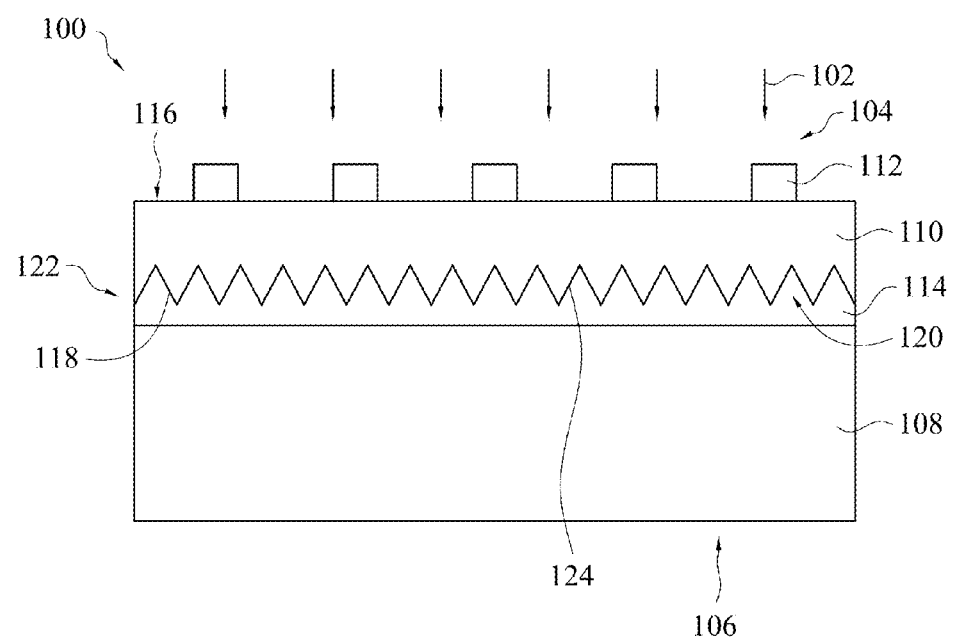
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a CMOS image sensor, a dry etching operation is performed on a semiconductor layer to form various microstructures on a surface of the semiconductor layer for multiply refracting incident light, so as to increase the light absorption ratio of the semiconductor layer, thereby improving quantum efficiency and full well capacity of the CMOS image sensor. However, the surface of the semiconductor layer is damaged during the dry etching operation, so that a white pixel phenomenon of the CMOS image sensor is significantly worsened.

Embodiments of the present disclosure are directed to providing a semiconductor device and a method for manufacturing the semiconductor device, in which a wet etching operation is performed to form various recesses, such as inverted pyramid recesses, in a surface of a substrate, so that the light absorption ratio of the substrate is increased while preventing surfaces of the recesses from being damaged by plasma used in a dry etching operation. Thus, quantum efficiency and photoluminescence intensity of the semiconductor device are enhanced, and a white pixel phenomenon of the semiconductor device is greatly improved. Furthermore, the wet etching operation has better uniformity and reproducibility, so that the operation of forming the recesses has well profile control.

FIG. 1 is a schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some examples, the semiconductor device 100 is a FSI CMOS image sensor device, which is operated to sense the incident light 102 projected from its front side 104. As shown in FIG. 1, the semiconductor device 100 includes a carrier 108, a substrate 110, various light-sensing devices 112 and a bonding layer 114. The carrier 108 may be a semiconductor carrier. The carrier 108 may be composed of a single-crystalline semiconductor material or a compound semiconductor material. For example, the carrier 108 is a silicon carrier. In some examples, germanium or glass may also be used as a material of the carrier 108.

The substrate 110 is disposed over the carrier 108. In some examples, the substrate 110 is formed from epitaxial silicon and/or epitaxial germanium. The substrate 110 has a first surface 116 and a second surface 118, which are located on two opposite sides of the substrate 110. The substrate 110 includes various recesses 120 formed in the second surface 118. In some examples, each recess 120 is an inverted pyramid recess. The inverted pyramid recess may be an inverted polygonal pyramid recess, such as an inverted triangular pyramid recess, an inverted tetragonal pyramid recess, an inverted pentagonal pyramid recess, an inverted hexagonal pyramid recess and etc. For example, the semiconductor device 100 may include a waffle structure 122 which includes the recesses 120, such as the inverted pyramid recesses. Each recess 120 has several surfaces 124. For example, while each recess 120 is an inverted tetragonal pyramid recess, the recess 120 has four surfaces 124. In some exemplary examples, each surface 124 of each recess 120 is a wet etched surface.

Figure 2A:
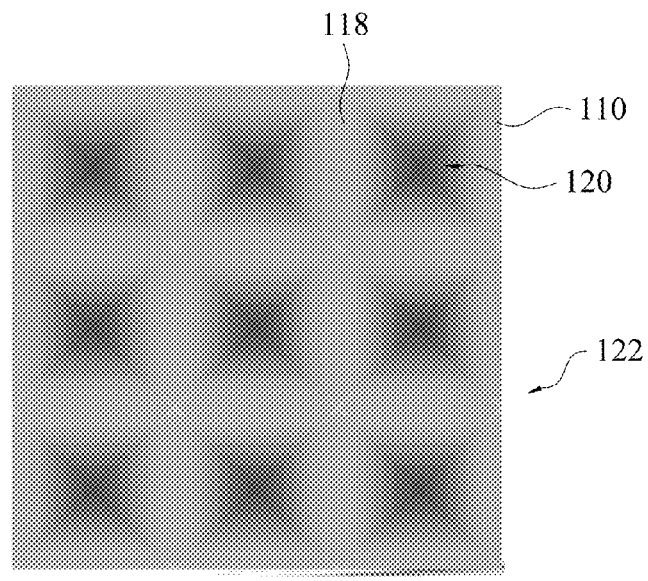
FIG. 2A is a schematic top view of a second surface of a substrate of a semiconductor device in accordance with various embodiments.
Figure 2B:
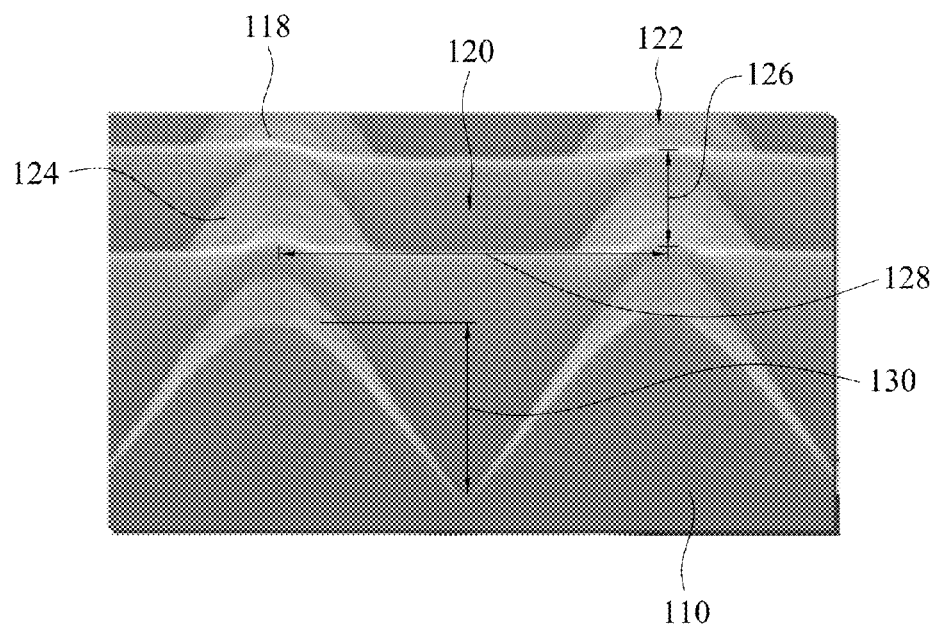
FIG. 2B is a schematic three-dimensional diagram of a second surface of a substrate of a semiconductor device in accordance with various embodiments.

Referring to FIG. 2A and FIG. 2B firstly, in which FIG. 2A is a schematic top view of a second surface of a substrate of a semiconductor device in accordance with various embodiments, and FIG. 2B is a schematic three-dimensional diagram of a second surface of a substrate of a semiconductor device in accordance with various embodiments. In some exemplary examples, as shown in FIG. 2A and FIG. 2B, the recesses 120 of the waffle structure 122 are inverted tetragonal pyramid recesses. For example, as shown in FIG. 2B, each recess 120 has a width 126, a length 128 and a depth 130, and each of the width 126, the length 128 and the depth 130 may range from 10 nm to 10000 nm.

Referring to FIG. 1 again, the light-sensing devices 112 are operated to sense the incident light 102. The light-sensing devices 112 are disposed on the first surface 116 of the substrate 110. In the examples that the semiconductor device 100 is a CMOS image sensor, the semiconductor device 100 includes various pixel regions, and the light-sensing devices 112 are respectively located in the pixel regions. In some examples, each light-sensing device 112 includes an image sensor element, in which the image sensor element includes a photodiode and other elements.

The bonding layer 114 is disposed between the second surface 118 of the substrate 110 and the carrier 108. As shown in FIG. 1, the bonding layer 114 is disposed on the second surface 118 of the substrate 110 and covers the recesses 120, i.e. the bonding layer 114 bonds the second surface 118 of the substrate 110 to the carrier 108, and the recesses 120 are opposite to the carrier 108 and are separated from the carrier 108 by the bonding layer 114. The bonding layer 114 may be composed of a transparent dielectric material, such as silicon dioxide, silicon nitride and silicon oxynitride. For example, the bonding layer 114 is formed from silicon dioxide, silicon nitride or silicon oxynitride while the carrier 108 is formed from silicon.

By forming recesses 120 in the second surface 118 of the substrate 110, a total reflection angle of the incident light 102 emitted from the substrate 110 to the bonding layer 114 is relatively small, so that some of the incident light 102 can be reflected back to the substrate 110, thereby increasing an amount of photoelectrons generated by the substrate 110. Hence, the light absorption ratio of the substrate 110 is increased, thereby enhancing quantum efficiency and photoluminescence intensity of the semiconductor device 100.

Figure 3:
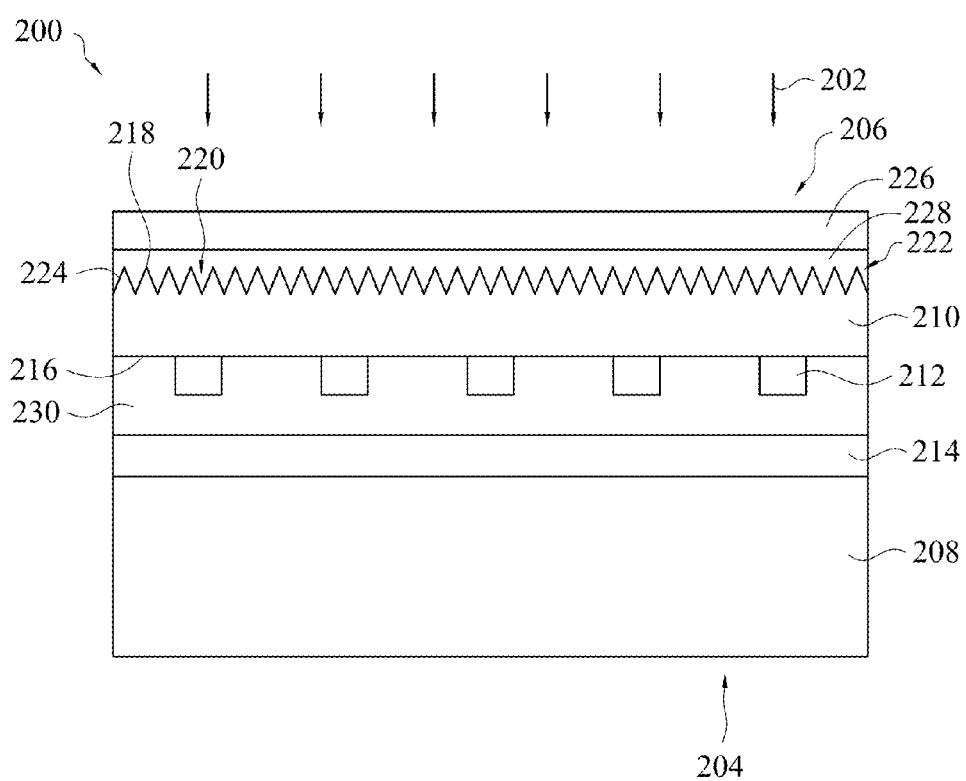
FIG. 3 is a schematic cross-sectional view of a semiconductor device in accordance with various embodiments.

FIG. 3 is a schematic cross-sectional view of a semiconductor device in accordance with various embodiments. In some embodiments, a semiconductor device 200 is a CMOS image sensor device, which may be operated for sensing incident light 202. The semiconductor device 200 has a front side 204 and a back side 206. In some examples, the semiconductor device 200 is a BSI CMOS image sensor device, which is operated to sense the incident light 202 projected from its back side 206. As shown in FIG. 3, the semiconductor device 200 includes a carrier 208, a substrate 210, various light-sensing devices 212 and a bonding layer 214. The carrier 208 may be a semiconductor carrier and may be composed of a single-crystalline semiconductor material or a compound semiconductor material. In some examples, silicon, germanium or glass may be used as a material of the carrier 208.

The substrate 210 is disposed over the carrier 208. In some examples, the substrate 210 is formed from epitaxial silicon and/or epitaxial germanium. The substrate 210 has a first surface 216 and a second surface 218 opposite to the first surface 216. The substrate 210 includes various recesses 220 formed in the second surface 218 of the substrate 210. In some examples, each recess 220 is an inverted pyramid recess. The inverted pyramid recess may be an inverted polygonal pyramid recess, such as an inverted triangular pyramid recess, an inverted tetragonal pyramid recess, an inverted pentagonal pyramid recess, an inverted hexagonal pyramid recess and etc. For example, the semiconductor device 200 may include a waffle structure 222 which includes the recesses 220. Each recess 220 has several surfaces 224. For example, while each recess 220 is an inverted tetragonal pyramid recess, the recess 220 has four surfaces 224. In some exemplary examples, each surface 224 of each recess 220 is a wet etched surface.

In some exemplary examples, the waffle structure 222 of the substrate 210 in the semiconductor device 200 is similar to the waffle structure 122 of the substrate 110 shown in FIG. 2A and FIG. 2B, and the recesses 220 of the waffle structure 222 are inverted tetragonal pyramid recesses. For example, similar to the recesses 120 of the waffle structure 122 shown in FIG. 2B, a width, a length and a depth of each recess 220 may all range from 10 nm to 10000 nm.

Referring to FIG. 3 again, the light-sensing devices 212 are operated to sense the incident light 202. The light-sensing devices 212 are disposed on the first surface 216 of the substrate 210. In the examples that the semiconductor device 200 is a CMOS image sensor, the semiconductor device 200 includes various pixel regions, and the light-sensing devices 212 are respectively located in the pixel regions. In some examples, each light-sensing device 212 includes an image sensor element, in which the image sensor element includes a photodiode and other elements.

The bonding layer 214 is disposed between the first surface 216 of the substrate 210 and the carrier 208. As shown in FIG. 3, the bonding layer 214 is disposed on the first surface 216 of the substrate 210 and covers the light-sensing devices 212, i.e. the bonding layer 214 bonds the first surface 216 of the substrate 210 to the carrier 208, and the light-sensing devices 212 are opposite to the carrier 208 and separated from the carrier 208 by the bonding layer 214.

The bonding layer 214 may be composed of a transparent dielectric material, such as silicon dioxide, silicon nitride and silicon oxynitride. For example, the bonding layer 214 is formed from silicon dioxide, silicon nitride or silicon oxynitride while the carrier 208 is formed from silicon.

By forming recesses 220 in the second surface 218 of the substrate 210, an area of the second surface 218 is increased, and an incident angle of the incident light 202 projected to the second surface 218 is smaller than that of the incident light 202 projected to a planar surface, so that most of the incident light 202 can be multiply refracted and reflected in the recesses 220, thereby increasing an amount of photo-electrons generated by the substrate 210. Hence, the light absorption ratio of the substrate 210 is increased, thereby enhancing quantum efficiency and photoluminescence intensity of the semiconductor device 200.

In some examples, as shown in FIG. 3, the semiconductor device 200 may optionally include a passivation layer 226 disposed on the second surface 218 of the substrate 210 and covering the recesses 220. The passivation layer 226 is suitable for protecting the recesses 220 from being damaged. The passivation layer 226 may be formed from silicon oxide, silicon nitride or silicon oxynitride.

In some examples, the semiconductor device 200 may optionally include a transparent dielectric layer 228 disposed on the second surface 218 of the substrate 210 and covering the recesses 220. As shown in FIG. 3, the transparent dielectric layer 228 is disposed under the passivation layer 226, i.e. the transparent dielectric layer 228 is disposed between the passivation layer 226 and the second surface 218 of the substrate 210. In some exemplary examples, the transparent dielectric layer 228 is formed from silicon dioxide, silicon nitride or silicon oxynitride while the substrate 210 is formed from epitaxial silicon.

In some examples, as shown in FIG. 3, the semiconductor device 200 may optionally include another passivation layer 230 disposed on the first surface 216 of the substrate 210 and covering the light-sensing devices 212 and the first surface 216 of the substrate 210. The passivation layer 230 is disposed on the bonding layer 214, i.e. the passivation layer 230 is disposed between the first surface 216 of the substrate 210 and the bonding layer 214. The passivation layer 230 is suitable for protecting the light-sensing devices 212 and the substrate 210 from being damaged. The passivation layer 230 may be formed from silicon oxide, silicon nitride or silicon oxynitride.

Figure 4A:
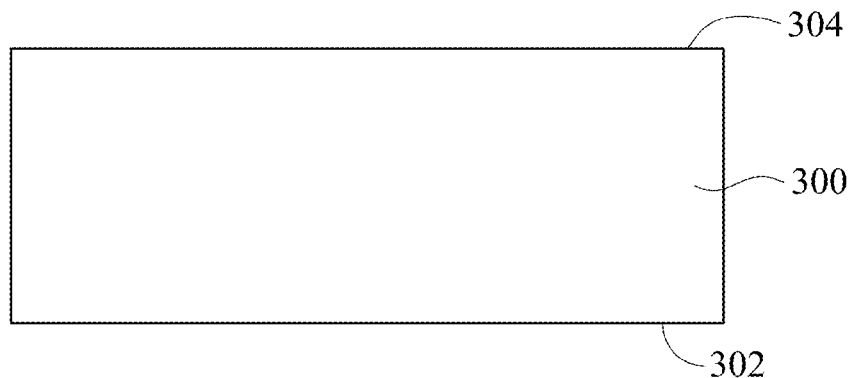
FIG. 4A through FIG. 4F are schematic cross-sectional views of intermediate stages showing a method for manufacturing recesses in a surface of a substrate of a semiconductor device in accordance with various embodiments.

Referring to FIG. 4A through FIG. 4F, FIG. 4A through FIG. 4F are schematic cross-sectional views of intermediate stages showing a method for manufacturing recesses in a surface of a substrate of a semiconductor device in accordance with various embodiments. As shown in FIG. 4A, a substrate 300 of a semiconductor device is provided. The substrate 300 has a first surface 302 and a second surface 304 opposite to the first surface 302. In some examples, the substrate 300 is formed from epitaxial silicon and/or epitaxial germanium.

Figure 4B:
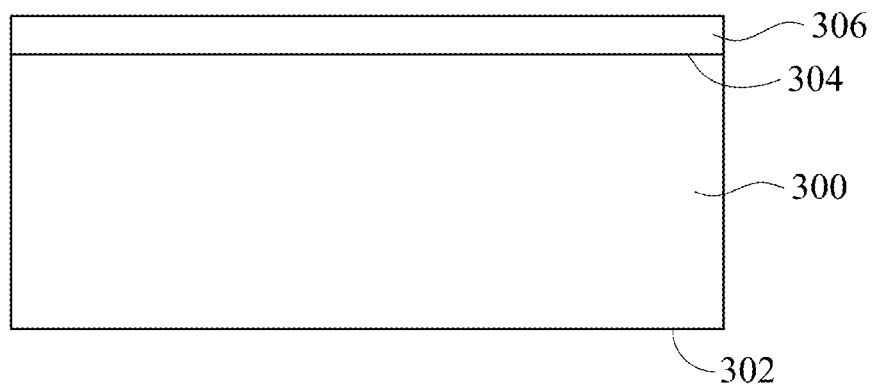
Figure 4C:
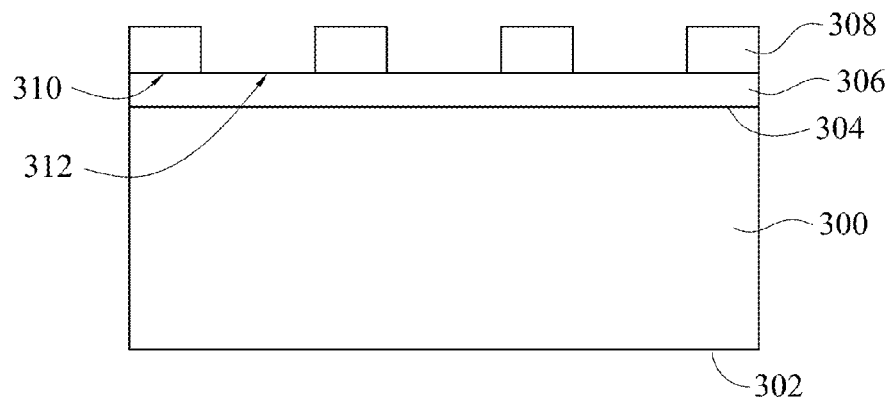

As shown in FIG. 4B, a hard mask material layer 306 is blanketly formed to cover the second surface 304 of the substrate 300. In some examples, the operation of forming the hard mask material layer 306 includes forming the hard mask material layer 306 from silicon oxide, silicon nitride or silicon oxynitride. In some examples, as shown in FIG. 4C, a patterning layer 308 is formed on a portion 310 of the hard mask material layer 306 to expose the other portion 312 of the hard mask material layer 306. For example, the operation of forming the patterning layer 308 may include forming the patterning layer 308 from a photo-resist material. In addition, the operation of forming the patterning layer 308 may include subsequently performing an exposure operation and a development operation on a patterning material layer to pattern the patterning material layer, so as to form the patterning layer 308 on the portion 310 of the hard mask material layer 306.

Figure 4D:
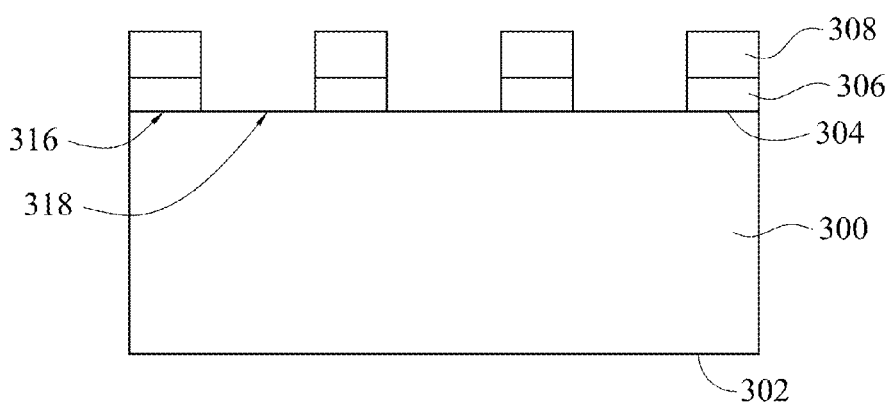
Figure 4E:
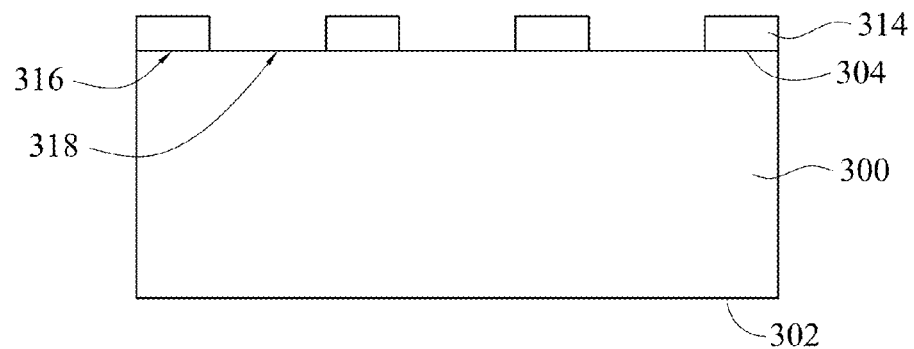

After the patterning layer 308 is formed, an etching operation may be performed on the portion 312 of the hard mask material layer 306 to remove a portion of the hard mask material layer 306 by using the patterning layer 308 as an etching mask, so as to form a hard mask layer 314 on a portion 316 of the second surface 304 of the substrate 300 and expose the other portion 318 of the second surface 304 of the substrate 300, as shown in FIG. 4D. Then, as shown in FIG. 4E, the patterning layer 308 may be removed to expose the hard mask layer 314.

Figure 4F:
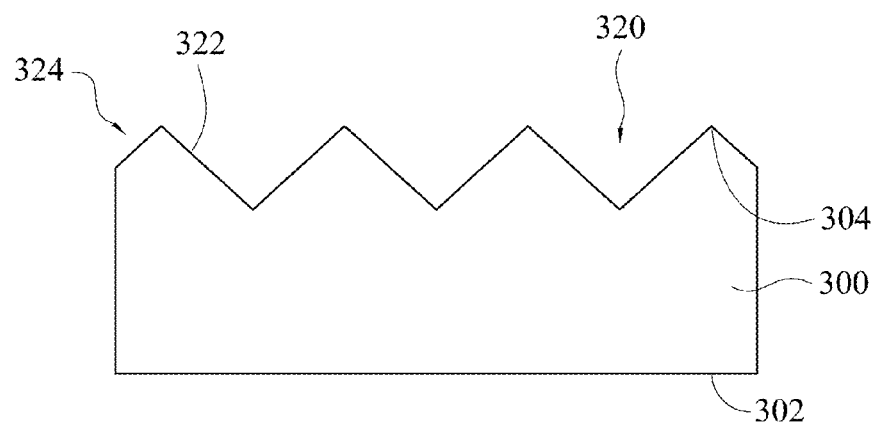

In some examples, as shown in FIG. 4F, a wet etching operation is performed on the portion 318 of the second surface 304 of the substrate 300 by using the hard mask layer 314 as a wet etching mask, so as to remove a portion of the substrate 300 and form various recesses 320 in the second surface 304 of the substrate 300. The recesses 320 are formed by using the wet etching operation, so that surfaces 322 of each recess 320 are wet etched surfaces. In some examples, the wet etching operation is performed to form each recess 320 being an inverted pyramid recess. The inverted pyramid recess may be an inverted polygonal pyramid recess, such as an inverted triangular pyramid recess, an inverted tetragonal pyramid recess, an inverted pentagonal pyramid recess, an inverted hexagonal pyramid recess and etc. For example, the wet etching operation may be performed to form a waffle structure 324 including the recesses 320, such as the inverted pyramid recesses.

By using a wet etching operation to form the recesses 320 in the second surface 304 of the substrate 300, it can prevent the surfaces 322 of the recesses 320 from being damaged by plasma used in a dry etching operation. Thus, quantum efficiency and photoluminescence intensity of the semiconductor device are enhanced while a white pixel phenomenon of the semiconductor device is significantly improved. Furthermore, the wet etching operation has better uniformity and reproducibility, so that the operation of forming the recesses 322 has well profile control.

Figure 5A:
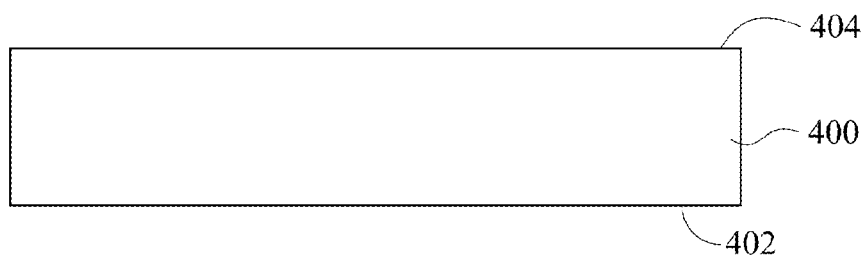
FIG. 5A through FIG. 5F are schematic cross-sectional views of intermediate stages showing a method for manufacturing a semiconductor device in accordance with various embodiments.

Referring to FIG. 5A through FIG. 5F, FIG. 5A through FIG. 5F are schematic cross-sectional views of intermediate stages showing a method for manufacturing a semiconductor device in accordance with various embodiments. As shown in FIG. 5A, a substrate 400 is provided. In some examples, the substrate 400 is formed from epitaxial silicon and/or epitaxial germanium. The substrate 400 has a first surface 402 and a second surface 404 opposite to the first surface 402.

Figure 5B:
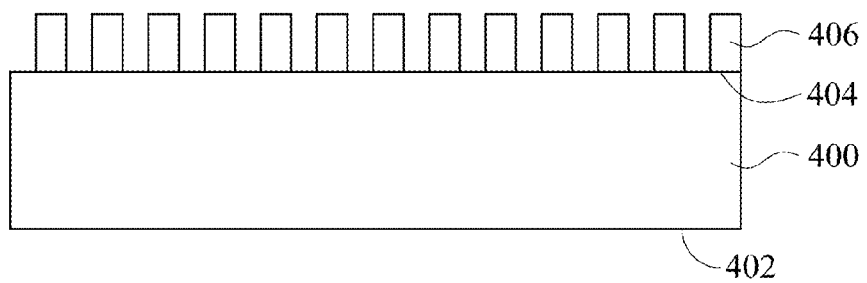
Figure 5C:
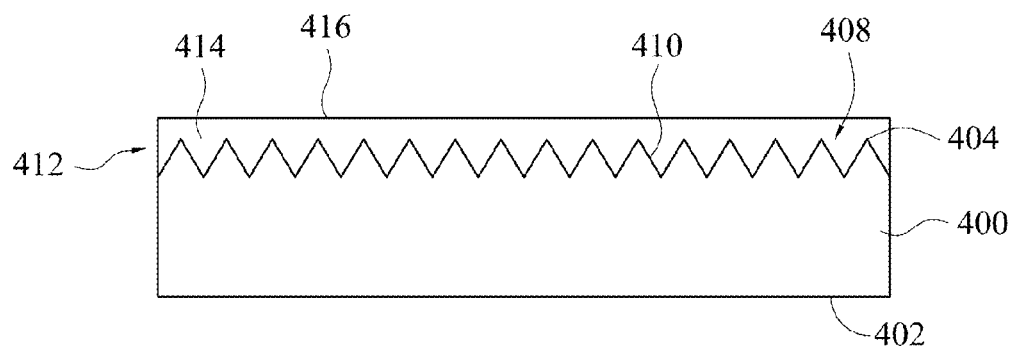

As shown in FIG. 5B and FIG. 5C, various recesses 408 are formed in the second surface 404 of the substrate 400. In some examples, the operation of forming the recesses 408 is performed using a photolithography process and an etching process. For example, the operation of forming the recesses 408 is similar to that of forming the recesses 320 in the second surface 304 of the substrate 300 described above relative to FIG. 4A through FIG. 4F. In some exemplary examples, as shown in FIG. 5B, a hard mask layer 406 is formed on a portion of the second surface 404 of the substrate 400 and exposing the other portion of the second surface 404. The operation of forming the hard mask layer 406 may be performed using a deposition process, a photolithography process and an etching process. In addition, the operation of forming the hard mask layer 406 may include forming the hard mask layer 406 from silicon oxide, silicon nitride or silicon oxynitride.

In some examples, after the hard mask layer 406 is formed, a wet etching operation is performed on the substrate 400 by using the hard mask layer 406 as an etching mask, so as to remove a portion of the substrate 400 from the exposed portion of the second surface 404 of the substrate 400 and form the recesses 408 in the second surface 404, as shown in FIG. 5C. The recesses 408 are formed by using the wet etching operation, so that surfaces 410 of each recess 408 are wet etched surfaces. In some examples, the wet etching operation is performed to form each recess 408 being an inverted pyramid recess. The inverted pyramid recess may be an inverted polygonal pyramid recess, such as an inverted triangular pyramid recess, an inverted tetragonal pyramid recess, an inverted pentagonal pyramid recess, an inverted hexagonal pyramid recess and etc. For example, the wet etching operation may be performed to form a waffle structure 412 including the recesses 408, such as the inverted pyramid recesses. The waffle structure 412 and the recesses 408 may be respectively similar to the waffle structure 122 and the recesses 120 described above relative to FIG. 2A and FIG. 2B. After the recesses 408 are formed in the second surface 404 of the substrate 400, the remaining hard mask layer 406 is removed from the substrate 400.

Referring to FIG. 5C again, in some examples, after the operation of forming the recesses 408 is completed, a bonding layer 414 is formed on the second surface 404 of the substrate 400 and covering the recesses 408. For example, the operation of forming the bonding layer 414 may be performed by using a thermal oxidation technique or a deposition technique, such as a chemical vapor deposition (CVD) technique. The operation of forming the bonding layer 414 may include forming the bonding layer 414 from a transparent dielectric material, such as silicon dioxide, silicon nitride or silicon oxynitride. In some exemplary examples, the operation of forming the bonding layer 414 includes forming a layer of bonding material to cover the recess 408, and then a planarization operation is performed on the layer of the bonding material to planarize a top surface of the layer of the bonding material, so as to form the bonding layer 414 on the second surface 404 of the substrate 400. Thus, a surface 416 of the bonding layer 414 is planar after the planarization operation. For example, the planarization operation may be performed using a chemical mechanical polishing (CMP) technique.

Figure 5D:
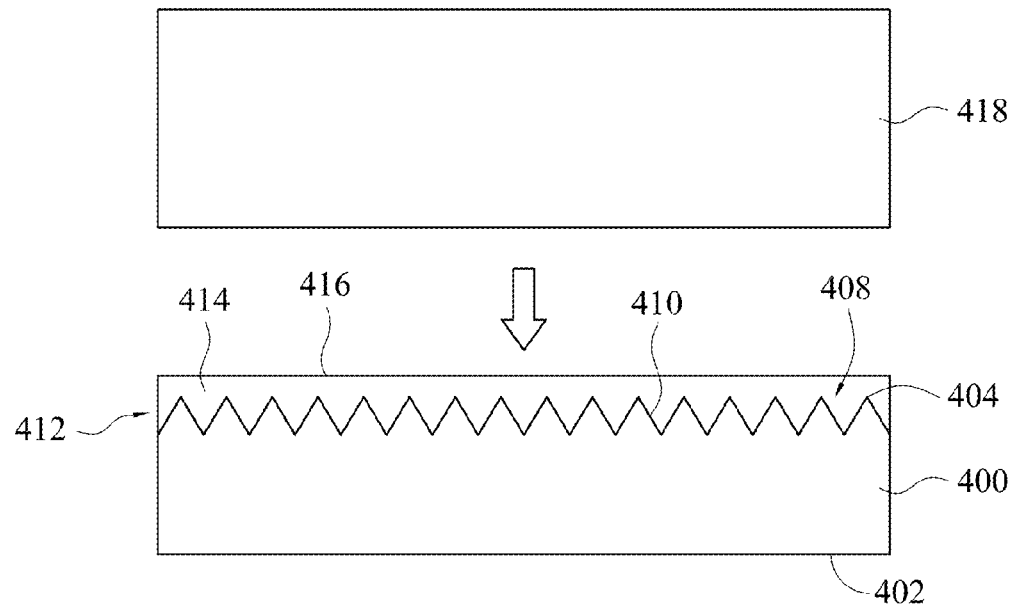

As shown in FIG. 5D, a carrier 418 is provided and the substrate 400 is bonded to the carrier 418 using the bonding layer 414, i.e. the operation of bonding the substrate 400 to the carrier 418 is performed to bond the second surface 404 of the substrate 400 to the carrier 418 using the bonding layer 414. In some examples that a planarization operation has been performed on the bonding layer 414, because the surface 416 of the bonding layer 414 is planarized, the carrier 418 can be successfully bonded to the bonding layer 414. After the operation of bonding the substrate 400 to the carrier 418, the recesses 408 and the carrier 418 are respectively on two opposite sides of the bonding layer 414. In some examples, the carrier 418 is a semiconductor carrier, and may be composed of a single-crystalline semiconductor material or a compound semiconductor material. For example, silicon, germanium or glass may be used as a material of the carrier 418.

Figure 5E:
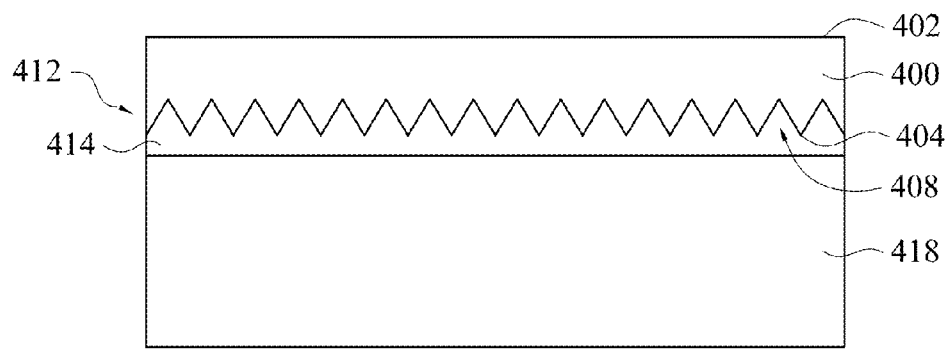
Figure 5F:
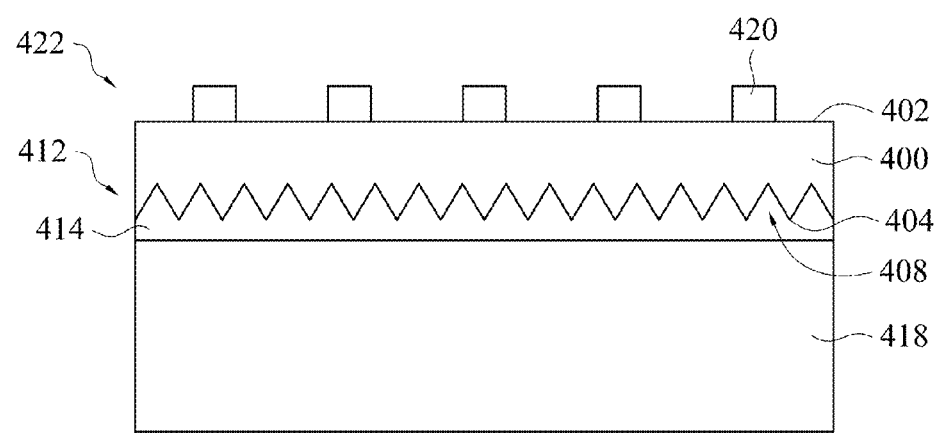

As shown in FIG. 5E, the structure composed of the substrate 400, the bonding layer 414 and the carrier 418 is reversed. In some examples, the substrate 400 is thinned optionally to remove a portion of the substrate 400 from the first surface 402 of the substrate 400. For example, the operation of thinning the substrate 400 may be performed using a wet etching technique or a CMP technique. As shown in FIG. 5F, various light-sensing devices 420 are formed on the first surface 402 of the substrate 400 to complete a semiconductor device 422. In the process for manufacturing the semiconductor device 422, the operation of forming the light-sensing devices 420 is performed after the operation of bonding the second surface 404 of the substrate 400 to the carrier 418. In some examples, each light-sensing device 420 includes an image sensor element, in which the image sensor element includes a photodiode and other elements.

Figure 6:
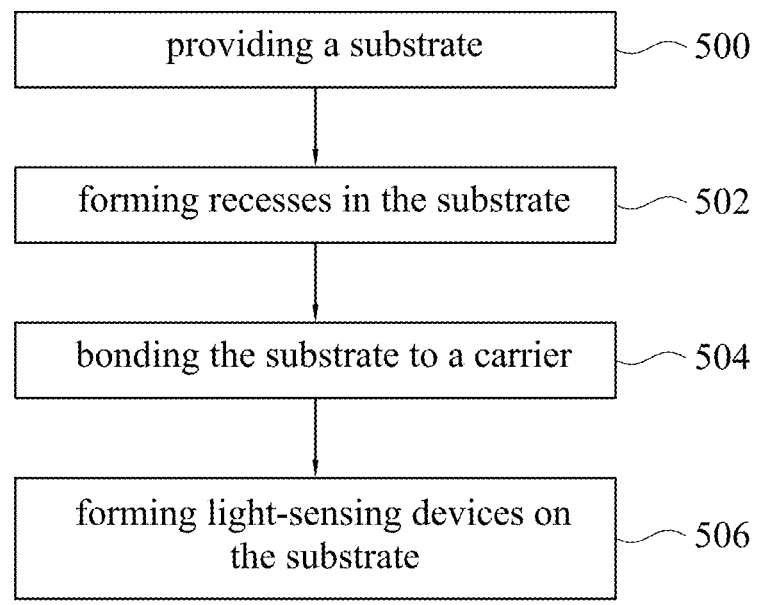
FIG. 6 is a flow chart of a method for manufacturing a semiconductor device in accordance with various embodiments.

Referring to FIG. 6 with FIG. 5A through FIG. 5F, FIG. 6 is a flow chart of a method for manufacturing a semiconductor device in accordance with various embodiments. The method begins at operation 500, where a substrate 400 is provided. As shown in FIG. 5A, the substrate 400 has a first surface 402 and a second surface 404 opposite to the first surface 402.

At operation 502, as shown in FIG. 5B and FIG. 5C, various recesses 408 are formed in the second surface 404 of the substrate 400 using, for example, a photolithography process and an etching process. The operation of forming the recesses 408 may be similar to that of forming the recesses 320 in the second surface 304 of the substrate 300 described above relative to FIG. 4A through FIG. 4F. In some exemplary examples, as shown in FIG. 5B, a hard mask layer 406 is formed on a portion of the second surface 404 of the substrate 400 and exposing the other portion of the second surface 404 by using, for example, a photolithography process and an etching process.

Then, as shown in FIG. 5C, a wet etching operation is performed on the substrate 400 by using the hard mask layer 406 as an etching mask, so as to remove a portion of the substrate 400 from the exposed portion of the second surface 404 of the substrate 400 and form the recesses 408 in the second surface 404. The recesses 408 are formed by using the wet etching operation, so that surfaces 410 of each recess 408 are wet etched surfaces. In some examples, the wet etching operation is performed to form each recess 408 being an inverted pyramid recess, such as an inverted polygonal pyramid recess. For example, the wet etching operation may be performed to form a waffle structure 412 including the recesses 408, such as the inverted pyramid recesses. After the recesses 408 are formed in the second surface 404 of the substrate 400, the remaining hard mask layer 406 is removed from the substrate 400 by, for example, an etching technique.

At operation 504, as shown in FIG. 5C and FIG. 5D, the substrate 400 is bonded to a carrier 418. In the operation of bonding the substrate 400 to the carrier 418, a bonding layer 414 is formed on the second surface 404 of the substrate 400 and covering the recesses 408 by using a thermal oxidation technique or a deposition technique, such as a CVD technique. In some exemplary examples, the operation of forming the bonding layer 414 includes forming a layer of bonding material to cover the recess 408, and then a planarization operation is performed on the layer of the bonding material to planarize a top surface of the layer of the bonding material, so as to form the bonding layer 414 on the second surface 404 of the substrate 400, as shown in FIG. 5C. Thus, a surface 416 of the bonding layer 414 is planar. For example, the planarization operation may be performed using a CMP technique. As shown in FIG. 5D, the carrier 418 is provided, and the second surface 404 of the substrate 400 is bonded to the carrier 418 using the bonding layer 414. After bonding, the recesses 408 are opposite to the carrier 418.

As shown in FIG. 5E, the structure composed of the substrate 400, the bonding layer 414 and the carrier 418 is reversed. The substrate 400 may be optionally thinned from the first surface 402 of the substrate 400 by using a wet etching technique or a CMP technique.

At operation 506, as shown in FIG. 5F, after the operation of bonding the second surface 404 of the substrate 400 to the carrier 418, various light-sensing devices 420 are formed on the first surface 402 of the substrate 400 to complete a semiconductor device 422. In some examples, each light-sensing device 420 includes an image sensor element, in which the image sensor element includes a photodiode and other elements.

Figure 7A:
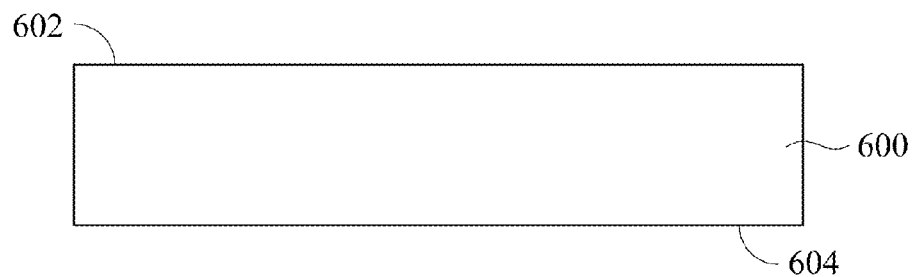
FIG. 7A through FIG. 7F are schematic cross-sectional views of intermediate stages showing a method for manufacturing a semiconductor device in accordance with various embodiments.

Referring to FIG. 7A through FIG. 7F, FIG. 7A through FIG. 7F are schematic cross-sectional views of intermediate stages showing a method for manufacturing a semiconductor device in accordance with various embodiments. As shown in FIG. 7A, a substrate 600 is provided. In some examples, the substrate 600 is formed from epitaxial silicon and/or epitaxial germanium. The substrate 600 has a first surface 602 and a second surface 604 opposite to the first surface 602.

Figure 7B:
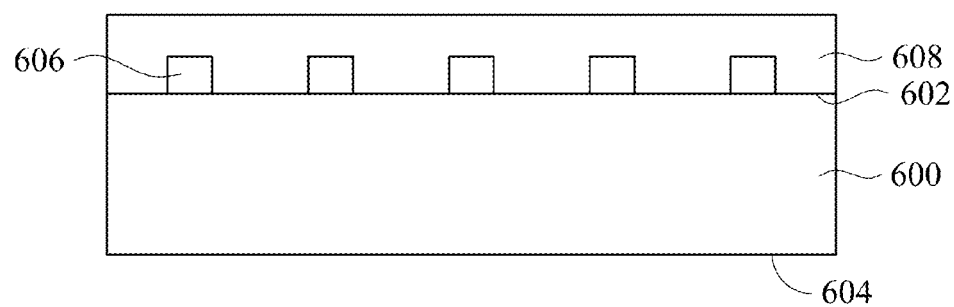

As shown in FIG. 7B, various light-sensing devices 606 are formed on the first surface 602 of the substrate 600. For example, each light-sensing device 606 may include an image sensor element, in which the image sensor element may include a photodiode and other elements. In some examples, referring to FIG. 7B again, a passivation layer 608 may be optionally formed on the first surface 602 of the substrate 600 and covering the light-sensing devices 606 and the first surface 602 of the substrate 600 for protecting the light-sensing devices 606 and the substrate 600 from being damaged. The passivation layer 608 may be formed from silicon oxide, silicon nitride or silicon oxynitride. In some exemplary examples, the operation of forming the passivation layer 608 is performed using a deposition technique, such a CVD technique and a plasma enhanced CVD (PECVD) technique.

Figure 7C:
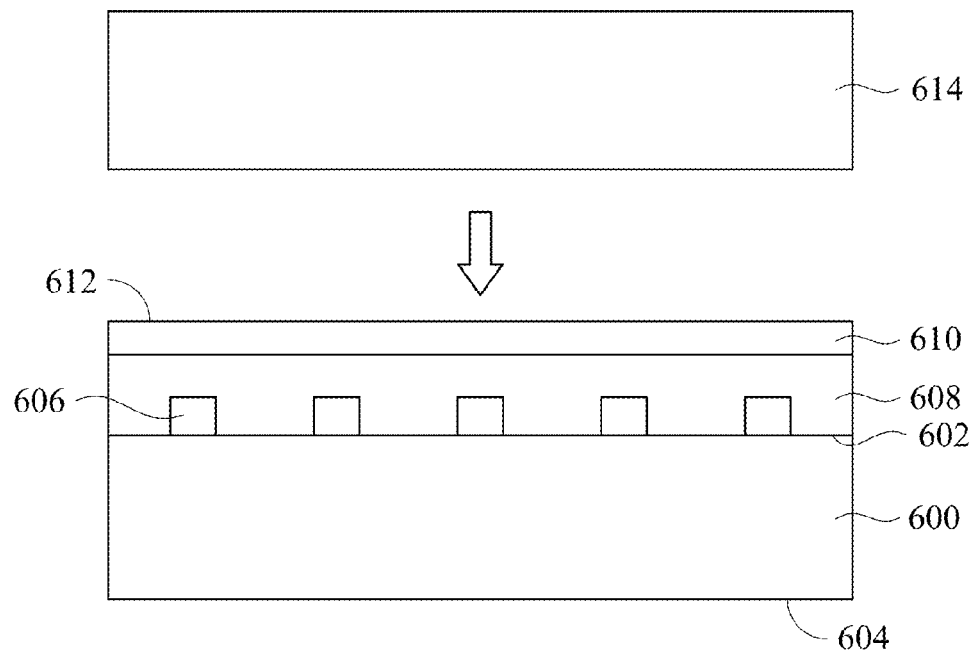

In some examples, a bonding layer 610 is formed above the first surface 602 of the substrate 600 and covering the light-sensing devices 606. In the examples that the passivation layer 608 is formed on the first surface 602 of the substrate 600, as shown in FIG. 7C, the bonding layer 610 is formed on the passivation layer 608. For example, the operation of forming the bonding layer 610 may be performed by using a deposition technique, such as a CVD technique. The operation of forming the bonding layer 610 may include forming the bonding layer 610 from a transparent dielectric material, such as silicon dioxide, silicon nitride or silicon oxynitride. In some exemplary examples, the operation of forming the bonding layer 610 includes forming a layer of bonding material to cover the passivation layer 608 on the first surface 602 of the substrate 600, and then a planarization operation is performed on the layer of the bonding material to planarize a top surface of the layer of the bonding material, so as to form the bonding layer 610 on the passivation layer 608 on the first surface 602 of the substrate 600. Thus, a surface 612 of the bonding layer 610 is planar. For example, the planarization operation may be performed using a CMP technique.

Referring to FIG. 7C again, a carrier 614 is provided and the substrate 600 is bonded to the carrier 614 using the bonding layer 610, i.e. the operation of bonding the substrate 600 to the carrier 614 is performed to bond the first surface 602 of the substrate 600 to the carrier 614 using the bonding layer 610. Because the surface 612 of the bonding layer 610 is planar, the carrier 614 can be successfully bonded to the bonding layer 610. After the operation of bonding the substrate 600 to the carrier 614, the light-sensing devices 606 are opposite to the carrier 614. In some examples, the carrier 614 is a semiconductor carrier, and may be composed of a single-crystalline semiconductor material or a compound semiconductor material. For example, silicon, germanium or glass may be used as a material of the carrier 614.

Figure 7D:
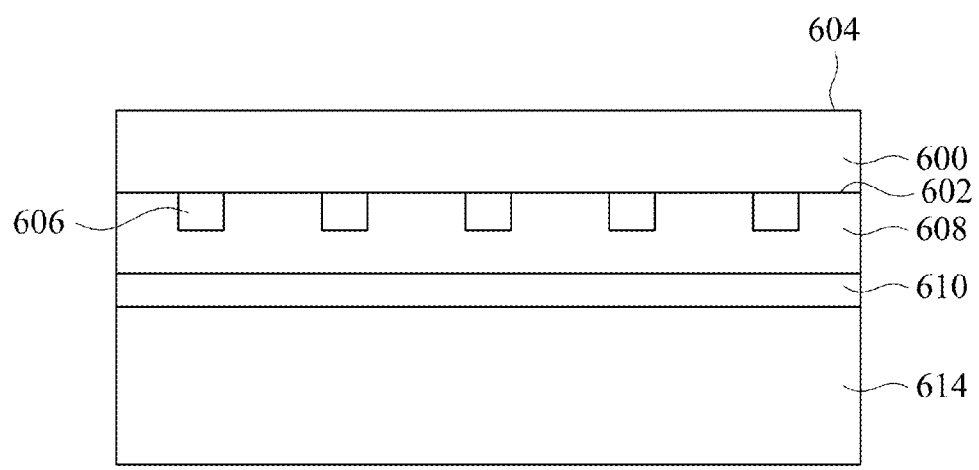

As shown in FIG. 7D, the structure composed of the substrate 600, the light-sensing devices 606, the passivation layer 608, the bonding layer 610 and the carrier 614 is reversed. The substrate 600 may be optionally thinned to remove a portion of the substrate 600 from the second surface 604 of the substrate 600. For example, the operation of thinning the substrate 600 may be performed using a wet etching technique or a CMP technique.

Figure 7E:
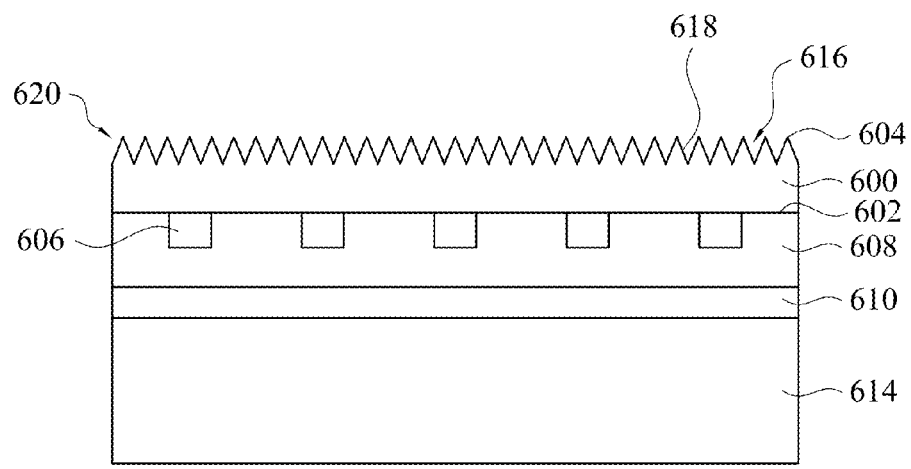

As shown in FIG. 7E, various recesses 616 are formed in the second surface 604 of the substrate 600, in which the operation of forming the recesses 616 is performed after the operation of forming the light-sensing devices 606 and the operation of bonding the substrate 600 to the carrier 614. In some examples, the operation of forming the recesses 616 is performed using a photolithography process and an etching process. For example, the operation of forming the recesses 616 is similar to that of forming the recesses 320 in the second surface 304 of the substrate 300 described above relative to FIG. 4A through FIG. 4F. In some examples, a wet etching operation is performed on the substrate 600 to remove a portion of the substrate 600 from the second surface 604 of the substrate 600 and form the recesses 616 in the second surface 604. The recesses 616 are formed by using the wet etching operation, so that surfaces 618 of each recess 616 are wet etched surfaces. In some examples, the wet etching operation is performed to form each recess 616 being an inverted pyramid recess. The inverted pyramid recess may be an inverted polygonal pyramid recess, such as an inverted triangular pyramid recess, an inverted tetragonal pyramid recess, an inverted pentagonal pyramid recess, an inverted hexagonal pyramid recess and etc. For example, the wet etching operation may be performed to form a waffle structure 620 including the recesses 616, such as the inverted pyramid recesses. The waffle structure 620 and the recesses 616 may be respectively similar to the waffle structure 122 and the recesses 120 described above relative to FIG. 2A and FIG. 2B.

Figure 7F:
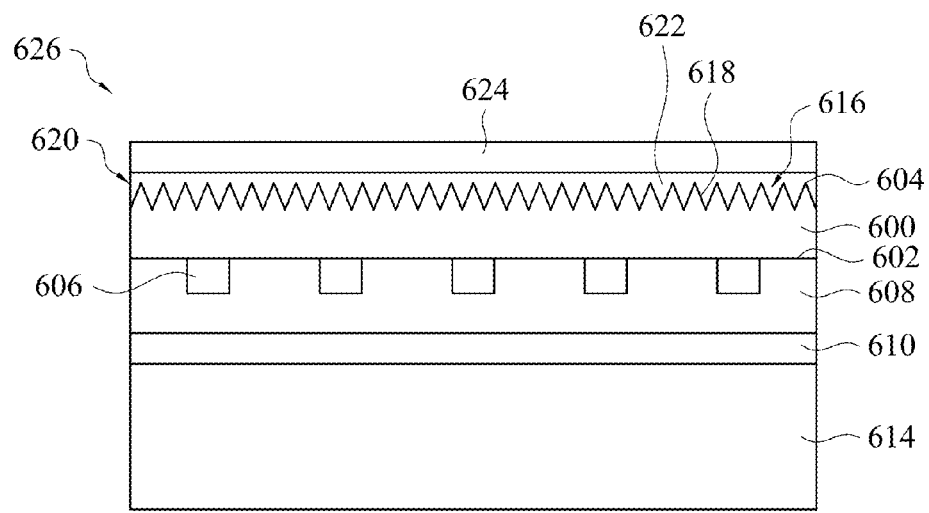

In some examples, as shown in FIG. 7F, a transparent dielectric layer 622 may be optionally formed on the second surface 604 of the substrate 600 and covering the recesses 616. In some examples, in the operation of forming the transparent dielectric layer 622, the transparent dielectric layer 622 is firstly formed to cover the recesses 616, and then a planarization operation is performed on the transparent dielectric layer 622 to planarize a top surface of the transparent dielectric layer 622. Thus, the top surface of the transparent dielectric layer 622 is planar after the planarization operation. In some exemplary examples, the operation of forming the transparent dielectric layer 622 is performed using a thermal oxidation technique or a CVD technique, and the planarization operation is performed using a CMP technique. For example, the transparent dielectric layer 622 may be formed from silicon dioxide, silicon nitride or silicon oxynitride.

Referring to FIG. 7F again, a passivation layer 624 may be optionally formed on the top surface of the transparent dielectric layer 622 and covering the recesses 616 to complete a semiconductor device 626. The passivation layer 624 is suitable for protecting the transparent dielectric layer 622 from being damaged. The passivation layer 624 may be formed from silicon oxide, silicon nitride or silicon oxynitride. In some exemplary examples, the operation of forming the passivation layer 624 is performed using a deposition technique, such a CVD technique and a PECVD technique.

Figure 8:
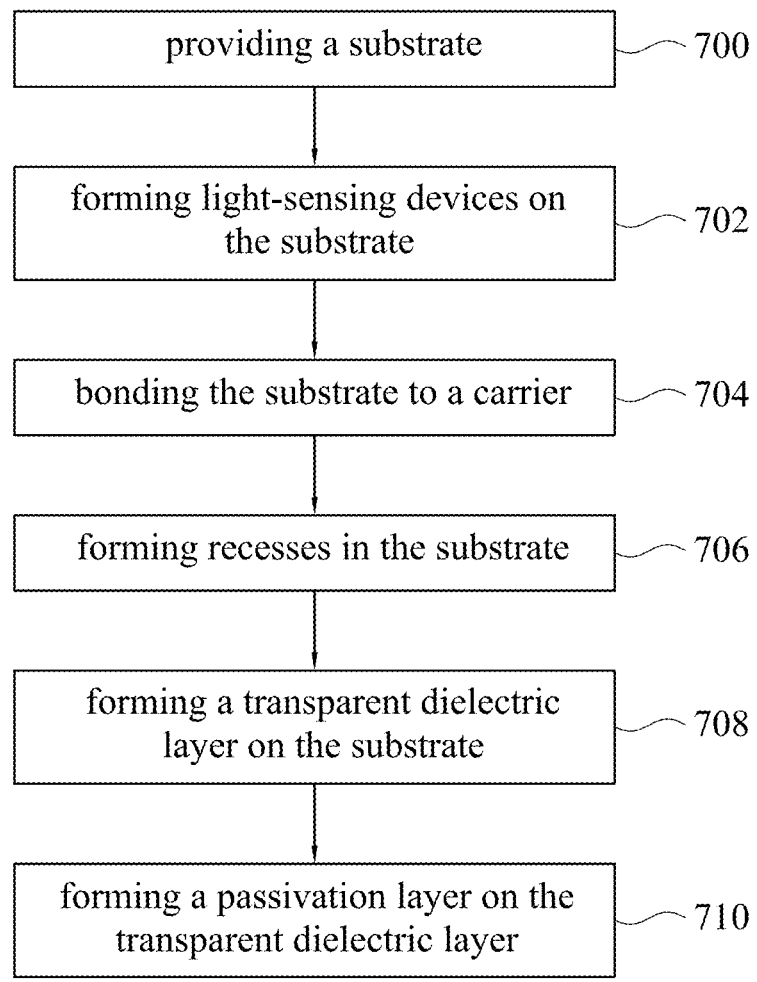
FIG. 8 is a flow chart of a method for manufacturing a semiconductor device in accordance with various embodiments.

Referring to FIG. 8 with FIG. 7A through FIG. 7F, FIG. 8 is a flow chart of a method for manufacturing a semiconductor device in accordance with various embodiments. The method begins at operation 700, where a substrate 600 is provided. As shown in FIG. 7A, the substrate 600 has a first surface 602 and a second surface 604 opposite to the first surface 602.

At operation 702, as shown in FIG. 7B, various light-sensing devices 606 are formed on the first surface 602 of the substrate 600. In some examples, each light-sensing device 606 includes an image sensor element, in which the image sensor element includes a photodiode and other elements. In some examples, referring to FIG. 7B again, a passivation layer 608 may be optionally formed on the first surface 602 of the substrate 600 and covering the light-sensing devices 606 and the first surface 602 of the substrate 600 for protecting the light-sensing devices 606 and the substrate 600 from being damaged by using a deposition technique, such a CVD technique and a PECVD technique.

At operation 704, as shown in FIG. 7C, the substrate 600 is bonded to a carrier 614. In the operation of bonding the substrate 600 to the carrier 614, a bonding layer 610 is formed on the passivation layer 608 on the first surface 602 of the substrate 600 and covering the light-sensing devices 606 by using a deposition technique, such as a CVD technique. In some exemplary examples, the operation of forming the bonding layer 610 includes forming a layer of bonding material to cover the passivation layer 608 on the first surface 602 of the substrate 600, and then a planarization operation is performed on the layer of the bonding material to planarize a top surface of the layer of the bonding material, so as to form the bonding layer 610 on the passivation layer 608. Thus, a surface 612 of the bonding layer 610 is planar. For example, the planarization operation may be performed using a CMP technique. Then, the carrier 614 is provided, and the first surface 602 of the substrate 600 is bonded to the carrier 614 using the bonding layer 610. After bonding, the light-sensing devices 606 are opposite to the carrier 614.

As shown in FIG. 7D, the structure composed of the substrate 600, the light-sensing devices 606, the passivation layer 608, the bonding layer 610 and the carrier 614 is reversed. The substrate 600 may be optionally thinned from the second surface 604 of the substrate 600 by using a wet etching technique or a CMP technique.

At operation 706, as shown in FIG. 7E, various recesses 616 are formed in the second surface 604 of the substrate 600 using, for example, a photolithography process and an etching process. The operation of forming the recesses 616 may be similar to that of forming the recesses 320 in the second surface 304 of the substrate 300 described above relative to FIG. 4A through FIG. 4F. In some examples, a wet etching operation is performed on the substrate 600 to remove a portion of the substrate 600 from the second surface 604 of the substrate 600 and form the recesses 616 in the second surface 604. The recesses 616 are formed by using the wet etching operation, so that surfaces 618 of each recess 616 are wet etched surfaces. In some examples, the wet etching operation is performed to form each recess 616 being an inverted pyramid recess, such as an inverted polygonal pyramid recess. For example, the wet etching operation may be performed to form a waffle structure 620 including the recesses 616, such as the inverted pyramid recesses. The waffle structure 620 and the recesses 616 may be respectively similar to the waffle structure 122 and the recesses 120 described above relative to FIG. 2A and FIG. 2B.

At operation 708, as shown in FIG. 7F, a transparent dielectric layer 622 may be optionally formed on the second surface 604 of the substrate 600 and covering the recesses 616. In some examples, the transparent dielectric layer 622 is firstly formed to cover the recesses 616, and then a planarization operation is performed on the transparent dielectric layer 622 to planarize a top surface of the transparent dielectric layer 622. In some exemplary examples, the operation of forming the transparent dielectric layer 622 is performed using a thermal oxidation technique or a CVD technique, and the planarization operation is performed using a CMP technique.

At operation 710, referring to FIG. 7F again, a passivation layer 624 may be optionally formed on the top surface of the transparent dielectric layer 622 and covering the recesses 616 to complete a semiconductor device 626 for protecting the transparent dielectric layer 622 from being damaged. In some exemplary examples, the operation of forming the passivation layer 624 is performed using a deposition technique, such a CVD technique and a PECVD technique.

In accordance with an embodiment, the present disclosure discloses a semiconductor device. The semiconductor device includes a carrier, a substrate, light-sensing devices and a bonding layer. The substrate overlies the carrier, and has a first surface and a second surface opposite to the first surface. The substrate includes inverted pyramid recesses in the second surface. The light-sensing devices are disposed on the first surface of the substrate. The bonding layer is disposed between the substrate and the carrier.

In accordance with another embodiment, the present disclosure discloses a method for manufacturing a semiconductor device. In this method, a substrate is provided. The substrate has a first surface and a second surface opposite to the first surface. Recesses are formed in the second surface of the substrate, in which surfaces of each of the recesses are wet etched surfaces. Light-sensing devices are formed on the first surface of the substrate. The substrate is bonded to a carrier using a bonding layer.

In accordance with yet another embodiment, the present disclosure discloses a method for manufacturing a semiconductor device. In this method, a substrate is provided. The substrate has a first surface and a second surface opposite to the first surface. Inverted pyramid recesses are formed in the second surface of the substrate. Light-sensing devices are formed on the first surface of the substrate. The substrate is bonded to a carrier using a bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a carrier;
   a substrate overlying the carrier and having a first surface and a second surface opposite to the first surface, wherein the substrate comprises a plurality of inverted pyramid recesses in the second surface;
   a plurality of light-sensing devices disposed on the first surface of the substrate; and
   a bonding layer disposed between the substrate and the carrier.

2. The semiconductor device of claim 1, wherein the substrate comprises a waffle structure comprising the inverted pyramid recesses.

3. The semiconductor device of claim 1, wherein each of a width and a length and a depth of each of the inverted pyramid recesses ranges from 10 nm to 10000 nm.

4. The semiconductor device of claim 1, wherein the bonding layer bonds the second surface of the substrate to the carrier, and the inverted pyramid recesses are opposite to the carrier.

5. The semiconductor device of claim 4, wherein the carrier is formed from silicon, and the bonding layer is formed from silicon dioxide, silicon nitride, or silicon oxynitride.

6. The semiconductor device of claim 1, wherein the bonding layer bonds the first surface of the substrate to the carrier, and the light-sensing devices are opposite to the carrier.

7. The semiconductor device of claim 6, further comprising a passivation layer disposed on the second surface of the substrate and covering the inverted pyramid recesses.

8. The semiconductor device of claim 7, further comprising a transparent dielectric layer disposed between the passivation layer and the second surface of the substrate and covering the inverted pyramid recesses.

9. The semiconductor device of claim 6, further comprising a passivation layer disposed between the first surface of the substrate and the bonding layer and covering the light-sensing devices.

10. The semiconductor device of claim 9, wherein the carrier is formed from silicon; the bonding layer is formed from silicon dioxide, silicon nitride, or silicon oxynitride; and the passivation layer is formed from silicon oxide, silicon nitride, or silicon oxynitride.

11. A method for manufacturing a semiconductor device, the method comprising:
    providing a substrate, the substrate having a first surface and a second surface opposite to the first surface;
    forming a plurality of inverted pyramid recesses in the second surface of the substrate;
    forming a plurality of light-sensing devices on the first surface of the substrate; and
    bonding the substrate to a carrier using a bonding layer.

12. The method of claim 11, wherein
    bonding the substrate to the carrier using the bonding layer comprises:
    forming the bonding layer on the second surface of the substrate and covering the inverted pyramid recesses; and
    bonding the second surface of the substrate to the carrier by the bonding layer,
    wherein forming the light-sensing devices is performed after bonding the second surface of the substrate to the carrier.

13. The method of claim 11, wherein
    forming the light-sensing devices is performed before forming the inverted pyramid recesses and
    bonding the substrate to the carrier using the bonding layer comprises:
    forming the bonding layer on the first surface of the substrate and covering the light-sensing devices; and
    bonding the first surface of the substrate to the carrier by the bonding layer,
    wherein forming the inverted pyramid recesses is performed after bonding the substrate to the carrier.

14. The method of claim 13, wherein after forming the inverted pyramid recesses, the method further comprises:
    forming a transparent dielectric layer on the second surface of the substrate and covering the inverted pyramid recesses; and
    forming a passivation layer on the transparent dielectric layer.

* * * * *